March 16, 1965 J. W. BREMER 3,174,124

CRYOGENIC ELECTRONIC DEVICE

Original Filed Oct. 17, 1960

Inventor:
John W. Bremer,
by Richard R. Brainard
His Attorney.

United States Patent Office 3,174,124

Patented Mar. 16, 1965

3,174,124

CRYOGENIC ELECTRONIC DEVICE

John W. Bremer, Sunnyvale, Calif., assignor to General Electric Company, a corporation of New York Original application Oct. 17, 1960, Ser. No. 63,197. Divided and this application Dec. 14, 1962, Ser. No. 252,541

7 Claims. (Cl. 338—32)

This invention relates to thin electrical insulating layers. More particularly, the invention relates to thin insulating layers as included in cryogenic electronic devices. This application is a division of my application Serial No. 63,197, filed October 17, 1960, entitled "Electrically Insulated Devices and Methods of Manufacture."

Very often thin insulating layers are required between closely spaced metallic conductors. For example, a switching device, called a cryogenic-electronic device, employs a pair of mutually perpendicular thin conducting films closely spaced but insulated where they cross one another. The crossed conductors of this device are constructed of materials which lose substantially all their resistance at temperatures near absolute zero. A current passed through the narrower of the films or "grid" film may then, however, develop a "critical" magnetic field capable of again restoring the resistance in the wider or "gate" film, thus exhibiting a useful gating action.

Further, while it is possible to deposit cryogenic apparatus upon an insulating base or substrate, superior results are achieved when a metallic base or substrate having certain properties is employed. This base or substrate, separated from the cryogenic device by a thin layer of insulation, may be formed of a superconducting material known to exhibit a critical field higher than the other elements of the cryogenic apparatus, whereby the substrate will then remain superconducting despite the presence of currents flowing over it. Such a superconducting metallic substrate, termed a shield-plane, has the property of being perfectly diamagnetic; that is it repels magnetic fields. This property causes a decrease in the inductance of the circuit deposited thereover and therefore results in an increase in operating speed for the device. But for the shield plane to have maximum effect, the spacing between the shield plane and the cryogenic device should be on the order of microns or less. Ordinary insulating films often contain faults and are subject to faults which electrically short out the cryogenic device and render it useless. The result is a device of low reproducibility.

It is therefore an object of the present invention to provide an improved very thin layer of insulating material which is homogeneous and electrically impervious when employed in close contact with electric conductors on either side thereof.

It is another object of the present invention to provide improved and suitable insulating layers between the cooperating superconducting layers in cryogenic electronic devices.

It is another object of this invention to provide an improved base for printed type cryogenic electronic devices which base has the properties of a perfect diamagnetic shield and which is thoroughly insulated with respect to the cryogenic device deposited thereon.

In accordance with one aspect of the invention, a first conductor or superconductor has an insulating layer deposited thereon. The insulating layer is chemically reacted, for example, oxidized by heat, whereby a newly formed material fills up or eradicates imperfections in the insulating layer during the course of the reaction. A second conductor is then deposited over and in close contact with the insulating layer.

According to another feature of the invention the conducting layers are both materials known to have superconducting properties and one of these materials is selected to have a higher critical field than the other so that it will act as a diamagnetic shield plane with respect to the other. The material providing the diamagnetic properties or base material is one having a melting point or oxidation point above the reaction temperature for the insulating material.

According to another feature of the invention, the insulating material is silicon monoxide, oxidized in-place to silicon dioxide, thereby forming an electrically impervious insulating layer.

The subject matter which I regard as my invention is particularly pointed out and distinctly claimed in the concluding portion of this specification. The invention, however, both as to organization and method of operation, together with further objects and advantages thereof, may best be understood by reference to the following description taken in connection with the accompanying drawings wherein like reference characters refer to like elements and in which:

Figure 1:
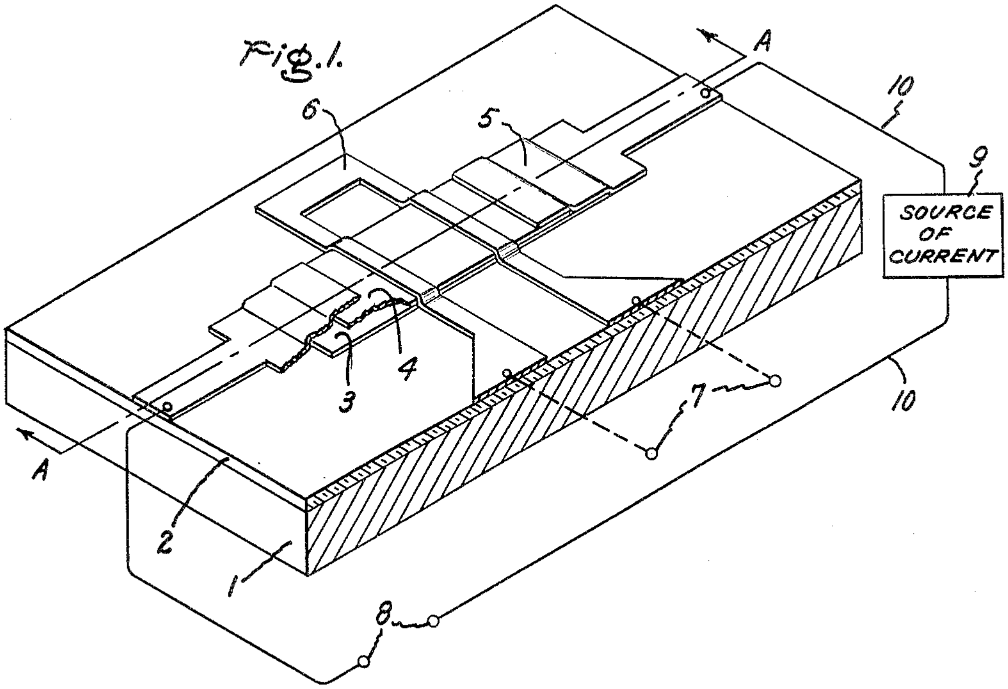
FIG. 1 is an isometric view of a cryogenic electronic device illustrating the present invention.
Figure 2:
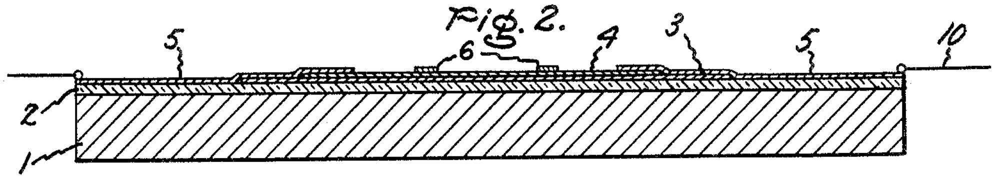
FIG. 2 is a cross-section of the FIG. 1 device along section A—A in FIG. 1.

Referring to FIGS. 1 and 2, illustrating a particular cryogenic electronic device, a metallic substrate 1 has deposited thereon a layer of insulating material 2, and a rectangular gate conductor 3 thereover which may be formed of tin or other material having a relatively low critical field. The gate conductor 3 is deposited on the insulating material 2, for example, by evaporating techniques. An insulating layer 4 is similarly deposited along the middle portion of gate conductor 3, but gate conductor 3 is left exposed at each end thereof so that connections 5 may be deposited over the ends of gate 3 to make electrical contact therewith. A narrow retroflexed grid 6 is laid down, for example, by evaporation, to cross the insulating material 4 with a narrow dimension of grid 6 being parallel to the gate 3. Grid 6 is formed of superconducting material having a higher critical field than gate 3 so that a current of sufficient magnitude applied to terminals 7 will cause a magnetic field to exist around grid 6 sufficient to render gate 3 non-superconductive or resistive, without at the same time rendering the grid 6 itself resistive. When the gate 3 thus becomes resistive, a reduction in voltage is detected at terminals 8 connected in series with gate 3, current source 9, and external conductors 10, the latter making electrical contact with connections 5.

Figure 3:
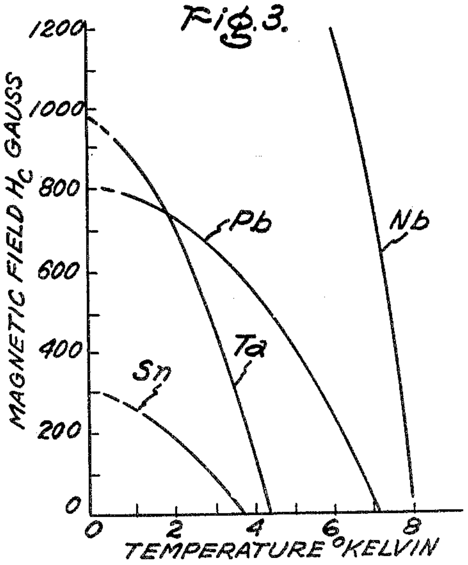
FIG. 3 is a graph, plotting the "critical" magnetic fields vs. temperature for various superconducting materials.

In the particular embodiment, the gate 3 may consist of a 0.3 micron deposited layer of tin, while insulating layer 4 may at least initially comprise a 0.4 micron deposited layer of silicon monoxide. Conductors 5 and grid 6 are 1.0 micron layers of deposited lead. In the specific example, base 1 is formed of niobium metal inasmuch as niobium has a high melting point (2515° C.) and a high critical field; the latter property of niobium may be ascertained from the FIG. 3 graph showing the relative magnetic fields which restore resistance in various superconductors at various temperatures. It can be seen that relatively high fields are required to restore resistance in niobium. Alternatively, tantalum may be similarly employed depending upon the other materials used in the device and their proximity to the base. The thickness of superconducting base 1 is not in itself critical and therefore the base 1 may alternatively consist of a conducting layer of niobium, for example, itself deposited upon an insulating plate of glass or separated from another base material by an insulating layer. The reason for employing a superconducting plane formed of a material having a relatively high critical field as a base, is to provide a diamagnetic shield plane for the cryogenic electronic device deposited thereover.

In considering the mechanism by which the shield plane operates, it is well to first consider the theory for the improved results desired. The speed of a cryogenic electronic device is dependent upon its time constant, $L/R$ where L is the inductance of the cryogenic device and circuit and R is its "normal" resistance. Therefore device operation may be speeded up by increasing its resistance, for example, by depositing the elements thereof as thin films having a relatively high resistivity. Another way of increasing the speed of such devices and circuits is to reduce the total inductance such as by making the component film conductors relatively wide. It is well-known in addition, however, that the inductance of a conductor can be reduced by returning the circuit current in an adjacent conductor in a manner similar to the ordinary transmission line. The same results are accomplished herein by employing the flux excluding properties of a superconducting plane, wherein the circuit is simply deposited on an insulated superconducting plane. Currents appear then to be excited in the superconducting plane by operation of the deposited circuit which create magnetic fields opposing the magnetic field of the superconducting circuit in such a manner that the magnetic field of the superconducting circuit is excluded from the superconducting plane. The total field between the superconducting surface plane and the device is increased but the field is reduced everywhere else so that a total net field reduction occurs. A proportional decrease in inductance results.

Mathematically, the situation is the same as that of an electrostatically charged film over a perfect conductor. In that case, the electrostatic field cannot penetrate the conductor and induces a screening charge in its surface. From the theorem of electrostatic images, we find that the field outside the conductor, due to the surface charges, is exactly the same as the field due to an equivalent image charge, which is of opposite polarity to the external charge and is the same distance behind the surface of the conductor as the external charge is in front. Arguing by analogy, it can be proved that a superconducting shield plane adjacent to a current produces a field equivalent to a parallel equal and opposite current, which is the same distance behind the surface of the superconductor as the external current is in front. Hence, by depositing a circuit on a superconducting shield plane, a current in any element in the circuit automatically induces an image current in the shield plane, which strongly reduces the inductance of that element.

In the device of the specific example the inductance of the circuit is reduced by two orders of magnitude and therefore the time constant is reduced by a like amount. Shielded cryogenic devices such as illustrated in FIGS. 1 and 2, operated at relatively high temperatures for such devices, and with no attempt to fully maximize the speed of operation, have had time constants from 0.1 to 0.4 microseconds. The switching speed for the device may be made less than a fraction of a microsecond and has not yet been measured in an unambiguous way.

In addition to reducing the circuit inductance and therefore its time constant, other desirable effects are achieved with a shield plane. The energy stored in the device magnetic field is reduced and therefore the energy dissipated when the field collapses, is likewise reduced, thereby improving the device's susceptibility to refrigeration. Also the presence of the shield leaves a more uniform distribution of current in the gate film 3. This leads to an increase in the "critical current" or series current at which gate 3 could become normal by itself without the aid of the magnetic field of grid 6, and therefore increases the current-carrying capacity of the gate.

The effectiveness of the shield plane and therefore the reduction in inductance, etc., is generally proportional to its distance from the cryogenic deposited over it, and, as stated, a thin layer of insulation is therefore desired between the shield plane and the device. Insulating layer 2 according to an embodiment of the invention may be formed initially as an 0.4 micron deposited layer of silicon monoxide. Silicon monoxide is used, inter alia, because it evaporates at fairly low temperatures and forms an insulating layer which is amorphous and adheres well to the underlying conductor. But such layer is subject to low reproducibility because of electrical shorts caused by pin holes in the deposited layer.

In accordance with an aspect of the present invention these imperfections are removed and a much more satisfactory thin insulating layer is achieved by reacting the insulating layer in-place, for example, by heating the silicon monoxide to produce a different substance. The reaction itself causes a certain movement of the material, filling up the pin holes and imperfections with reaction products. In the case of silicon monoxide the reaction product is presumably silicon dioxide or silica. The reaction converting the silicon monoxide largely to silicon dioxide is most easily carried on by heating or baking the silicon monoxide layer in air at a temperature in the range between approximately 300° C. and approximately 400° C. for a period of time in excess of 15 hours.

Figure 4:
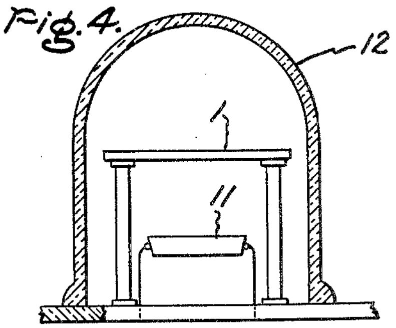
FIG. 4 is a view of an evaporation depositing apparatus employed with the present invention.

In a specific example, not to be taken in a limiting sense, a chemically cleaned plate of niobium sheet stock was mechanically polished to secure a smooth surface substrate, denominated 1 in the FIG. 1 and FIG. 4. A film of silicon monoxide was next evaporated upon the niobium sheet from a tantalum boat 11 shown in FIG. 4 located opposite the niobium sheet in a conventional film evaporating apparatus illustrated generally at 12 in FIG. 4. This silicon monoxide film was deposited to a depth of slightly less than .2 micron in thickness and this desired depth was conveniently determined using a light source and observing the interference colors produced thereby; the desired thickness is approximately achieved when the color red is observed for the second time. The niobium sheet with the adherent silicon monoxide coating was then removed from the film evaporating apparatus and baked in air at a temperature of 350° C. for 18 hours. This heating process changes the amorphous silicon monoxide coating into a relatively hard impervious and uniform layer wherein major portions are found to be silicon dioxide.

The heating time is not taken to be critical but the degree of oxidation achieved is dependent on this factor, increasing with time. Of course, oxidation also increases with temperature but the temperature should not be greater than the melting point of the substrate material employed.

The $SiO_2$ coated niobium base was then again removed to the evaporation apparatus wherein a gate film such as at 3 in FIG. 2 was deposited thereon through an appropriate rectangular shield. Then, another insulating layer illustrated at 4 in FIG. 2 was deposited thereover through a smaller shield so that the ends of gate 3 remain exposed. The other elements of the device including grid 6 and connections 5 were similarly deposited in the evaporation apparatus. The resulting cryogenic electronic gating device has been found to be free of pin holes between the substrate and the other elements and is therefore almost immune to the electric breakdown encountered heretofore under normal operating conditions.

It is pointed out that the above reaction with the insulation material occurs "in-place" after the unreacted insulation is deposited on the conductor, whereby the reaction itself is effective in perfecting the homogeneity of the final insulating layer.

According to another aspect of the present invention, niobium or tantalum material is the material employed as the superconducting shield plane. In prior cryogenic electronic devices a base formed of lead acted as the diamagnetic shield plane. However, lead has the disadvantage of melting at approximately 327° C., a temperature above which the aforementioned reaction on the insulation is most desirably carried out, e.g., if it is to be carried out in a reasonable time. However, niobium or tantalum work equally as well or better than lead as a shield plane in this device. Niobium has a melting point of approximately 2415° C., while tantalum has a melting point of approximately 2996° C., and, as can be observed from FIG. 3, both materials exhibit relatively high critical fields. Therefore, inclusion of niobium or tantalum substrate material contributes considerably to this advantageous cryogenic electronic device construction in accordance with an aspect of the present invention since the insulation reaction can accordingly be carried out in-place without harming the substrate or base material.

Although the invention has been particularly illustrated with reference to cryogenic electronic gating devices and is particularly useful in such devices, it is understood that the in-place reacted insulating film according to the present invention may be similarly employed in other devices where uniform, continuous, hard and coherent thin layers of electric insulation are desired between closely spaced conductors.

Further, although a niobium or tantalum sheet stock base is described, such base may similarly consist of a niobium or tantalum layer on an insulator.

While I have shown and described several embodiments of my invention, it will be apparent to those skilled in the art that many other changes and modifications may be made without departing from my invention in its broader aspects; and I therefore intend the appended claims to cover all such changes and modifications as fall within the true spirit and scope of my invention.

What I claim as new and desire to secure by Letters Patent of the United States is:

1. A flat base for a printed cryogenic electronic device comprising a superconducting metallic substrate comprising a first metal layer, a thin silicon dioxide insulating layer over said first metal layer which is substantially free of gaps and imperfections in the insulation by reason of being uniformly impervious, a deposited superconductor therover, and electrical connections to said superconductor, said first metal layer having a higher critical field than said superconductor and having a higher melting point than the oxidization temperature of silicon monoxide.

2. The device of claim 1 wherein said first metal layer is niobium.

3. The device of claim 1 wherein said first metal layer is niobium and said thin silicon dioxide insulating layer is less than one micron in thickness.

4. A cryogenic electronic device of the printed circuit type comprising a first superconductor, a second superconductor, and a thin film of deposited insulator disposed between said superconductors comprising silicon monoxide oxidized in-place to silicon dioxide.

5. A cryogenic electronic device of the printed circuit type comprising a first superconductor, a second superconductor requiring a higher magnetic field to cause cessation of its superconductivity at a given temperature than does said first superconductor, and a thin film of deposited insulator disposed between said superconductors comprising silicon monoxide oxidized in-place to silicon dioxide.

6. A cryogenic electronic device of the printed circuit type comprising a first superconductor, a second superconductor requiring a higher magnetic field to cause cessation of its superconductivity at a given temperature than does said first superconductor, said second superconductor being niobium, and a thin film of deposited insulator disposed between said superconductors comprising silicon monoxide oxidized in-place to silicon dioxide.

7. A cryogenic electronic device of the printed circuit type comprising a first superconductor, a second superconductor requiring a higher magnetic field to cause cessation of its superconductivity at a given temperature than does said first superconductor wherein the said first superconductor is tin and the said second superconductor is selected from the group consisting of niobium and tantalum, and a thin film of deposited insulator disposed between said superconductors comprising silicon monoxide oxidized in-place to silicon dioxide.

References Cited by the Examiner

UNITED STATES PATENTS

| | | | |
|---|---|---|---|
| 2,808,351 | 10/57 | Colbert et al. | 338—308 |
| 2,949,602 | 8/60 | Crowe. | |
| 2,983,889 | 5/61 | Green | 338—32 |
| 3,076,102 | 1/63 | Newhouse | 307—88.5 |

RICHARD M. WOOD, *Primary Examiner.*